(12) United States Patent
Kim et al.

(10) Patent No.: US 7,233,214 B2
(45) Date of Patent: Jun. 19, 2007

(54) VOLTAGE-CONTROLLED OSCILLATORS WITH CONTROLLED OPERATING RANGE AND RELATED BIAS CIRCUITS AND METHODS

(75) Inventors: Woo-Seok Kim, Gyeonggi-do (KR); Ju-Hyung Kim, Gyeonggi-do (KR)

(73) Assignee: Samsung Electronics Co., Ltd. (KR)

(*) Notice: Subject to any disclaimer, the term of this patent is extended or adjusted under 35 U.S.C. 154(b) by 153 days.

(21) Appl. No.: 11/198,691

(22) Filed: Aug. 5, 2005

(65) Prior Publication Data
US 2006/0033591 A1 Feb. 16, 2006

(30) Foreign Application Priority Data
Aug. 13, 2004 (KR) .................. 10-2004-0064058

(51) Int. Cl.
*H03L 1/02* (2006.01)
*H03L 7/099* (2006.01)
(52) U.S. Cl. .................. 331/176; 331/34; 331/57; 331/177 R; 331/186
(58) Field of Classification Search .............. 331/17, 331/34, 57, 176, 177 R, 185–186
See application file for complete search history.

(56) References Cited

U.S. PATENT DOCUMENTS

| 6,628,558 B2 | 9/2003 | Fiscus ................ 365/222 |
| 2003/0151396 A1* | 8/2003 | Self et al. ............. 323/312 |

FOREIGN PATENT DOCUMENTS

| JP | 04-259103 | 9/1992 |
| KR | 1999-0015967 | 6/1995 |
| KR | 1998-0056983 | 9/1998 |
| KR | 1999-0040491 | 6/1999 |
| KR | 2000-44682 | 7/2000 |
| KR | 10-2004-0012958 | 2/2004 |

OTHER PUBLICATIONS

Notice to Submit Response in Korean Application No. 10-2004-0064058; Date of mailing; Jul. 20, 2006.
English translation of Notice to Submit Response in Korean Application No. 10-2004-0064058; Date of mailing Jul. 20, 2006.

* cited by examiner

*Primary Examiner*—David Mis
(74) *Attorney, Agent, or Firm*—Myers Bigel Sibley & Sajovec

(57) ABSTRACT

A voltage-controlled oscillator includes a bias circuit and a delay circuit. The bias circuit may generate a bias voltage signal pair having levels that are based on the voltage level of an input voltage signal and that are constrained by the values of a maximum current signal and a minimum current signal that are generated in the bias circuit. The delay circuit generates an output signal having a frequency that varies in response to the bias voltage signal pair. Because an operating frequency range of a voltage-controlled oscillator VCO is limited by a bias circuit, the VCO can operate with reduced gain and can limit the maximum operating frequency to a predetermined level. The VCO may also include a PTAT current generator in the bias circuit which can allow the VCO to compensate for variations of the VCO output frequency based on temperature.

33 Claims, 14 Drawing Sheets

VOLTAGE-CONTROLLED OSCILLATORS WITH CONTROLLED OPERATING RANGE AND RELATED BIAS CIRCUITS AND METHODS

CLAIM OF PRIORITY

This application claims priority under 35 U.S.C. § 119 from Korean Patent Application No. 2004-64058 filed on Aug. 13, 2004 in the Korean Intellectual Property Office, the disclosure of which is hereby incorporated by reference herein as if set forth in its entirety.

FIELD OF THE INVENTION

The present invention relates to voltage-controlled oscillators and, in particular, to voltage-controlled oscillators that include bias circuits.

BACKGROUND OF THE INVENTION

Phase-locked loop (PLL) circuits are widely used to synchronize clocks that are applied to circuit blocks. PLL circuits are used in a variety of modern electronic systems, including, for example communication systems, multimedia systems and in various other applications such as in FM demodulators, clock recovery circuits and tone decoders.

Conventional PLL circuits include a voltage-controlled oscillator (VCO). The operating characteristics of the VCO can have a significant impact on the performance of both the PLL and the system in which the PLL is used. In many applications, the performance of the PLL circuit may be improved if the VCO in the PLL has a relatively small gain, operates only in a particular frequency range and is relatively insensitive to noise from the power supply.

FIG. 1 is a graph of the frequency of the output signal of a VCO as a function of input voltage and operating conditions in a conventional PLL circuit.

As shown in FIG. 1, when a conventional VCO is designed to operate at a maximum operating frequency under the worst condition, the gain of the VCO may become relatively large when the VCO is operated in the best or typical conditions. This may cause the VCO to be sensitive to noise. Additionally, variation in the gain (Hz/Volt) of the VCO changes the loop bandwidth of the PLL circuit. As such, the operating characteristic of the PLL circuit may vary based on the operating condition and, under certain circumstances, the PLL circuit may not lock since the PLL circuit may operate in an unstable range. As is also apparent from FIG. 1, if the VCO is designed to satisfy a maximum operating frequency in a worst condition, the VCO may operate at an overly high frequency during a best condition.

When such a VCO is used in a PLL circuit, the operating speed of the divider and Phase/Frequency Detector (PFD) of the PLL circuit may be lower than the operating speed of the VCO. As a result, the PLL circuit may operate abnormally.

SUMMARY OF THE INVENTION

Pursuant to embodiments of the present invention, voltage-controlled oscillators are provided which can operate with reduced gain by varying the operating frequency range of the device, and which can compensate for variation in gain that may arise with temperature variation.

According to certain embodiments of the present invention, voltage-controlled oscillators are provided that include (a) a bias circuit that is configured to generate an output current having a value that is between a maximum current value and a minimum current value in response to an input signal and (b) a delay circuit that is configured to generate an output signal having a frequency that is determined by the value of the output current of the bias circuit. In such embodiments, the bias circuit may include a first circuit that is configured to vary at least one of the maximum current value and/or the minimum current value as a function of a temperature of the bias circuit. The bias circuit may also be configured to generate one or more bias signals having respective values that are based on the output current. The frequency of the output signal may, for example, be based directly on these bias signals (and thus based indirectly on the value of the output current of the bias circuit). In these embodiments, the operating frequency range of the voltage-controlled oscillator may be based on the maximum current value and the minimum current value, and the first circuit may be configured to increase the maximum current value and the minimum current value with increasing temperature.

In these voltage-controlled oscillators, the frequency of the output signal may be substantially proportional to a voltage level of the input signal. The one or more bias signals may comprise a first voltage bias signal and a second voltage bias signal. The bias circuit may include a signal processor that is configured to (a) add a first current signal that has a value that is proportional to a voltage of the input signal to a minimum current signal that has the minimum current value to generate a second current signal, (b) generate a first voltage signal that corresponds to the second current signal and (c) generate a second voltage signal that corresponds to a maximum current signal that has the maximum current value. The bias circuit may also include a comparing unit that is configured to (a) generate the output current of the bias circuit in response to the first voltage signal and the second voltage signal and (b) generate the first voltage bias signal and the second voltage bias signal based on the output current of the bias circuit.

In certain of these embodiments, the comparing unit may also be configured to (a) subtract the maximum current signal from the second current signal to generate a third current signal and (b) subtract the third current signal from the second current signal to generate the output current of the bias circuit. In such embodiments, the comparing unit can be implemented, for example, as (a) a voltage-to-current converter that is configured to convert the first voltage signal to the second current signal, (b) a first subtracter circuit that is configured to subtract the maximum current signal from the second current signal to generate the third current signal and (c) a second subtracter circuit that is configured to subtract the third current signal from the second current signal to generate the output current of the bias circuit. The comparing unit may also include a current-to-voltage converter that is configured to generate the first voltage bias signal and the second voltage bias signal based on the output current of the bias circuit.

In some embodiments of the present invention, the output current of the bias circuit may have a value that is substantially equal to the maximum current value when the second current signal is larger than the maximum current signal, and have a value that is substantially equal to a current value of the second current signal when the second current signal is less than or equal to the maximum current signal.

The maximum current signal and the minimum current signal may vary based on a temperature of the bias circuit. For example, the maximum current signal and the minimum current signal may increase substantially linearly in proportion to the temperature. In such embodiments, the first current signal may decrease with increasing temperature, the minimum current signal may increase with increasing temperature and the output current of the bias circuit may decrease with increasing temperature. The bias circuit may include a proportional to absolute temperature (PTAT) current generator circuit that is configured to generate the maximum current signal and the minimum current signal, each of which may vary substantially in proportion to an absolute temperature.

The above-described bias circuits may also be implemented as stand-alone units according to further embodiments of the present invention, and related biasing methods may also be provided.

Pursuant to still further embodiments of the present invention, methods of generating an output signal in a voltage-controlled oscillator that includes a bias circuit are provided. Pursuant to these methods, a maximum current value and a minimum current value are set. Then a first current is generated that has a value that is constrained to be between the maximum current value and the minimum current value. The frequency of the output signal of the voltage-controlled oscillator is then set based on the value of the first current. In these methods, the maximum current level and the minimum current level may vary with temperature.

Pursuant to still further embodiments of the present invention, methods of controlling the gain of a voltage-controlled oscillator are provided in which the frequency of an output signal of the voltage-controlled oscillator is adjusted in response to an input signal to the voltage-controlled-oscillator. This adjustment is performed while constraining the amount that the frequency of the output signal is adjusted during any particular adjustment. Such constraining can be accomplished, for example, by (a) setting a maximum current value and a minimum current value, (b) generating a first bias signal and a second bias signal based on the input signal, the maximum current value and the minimum current value and (c) adjusting the frequency of the output signal based on the first and second bias signals. The maximum current value and the minimum current value may be set based on the temperature of the voltage-controlled oscillator.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1:
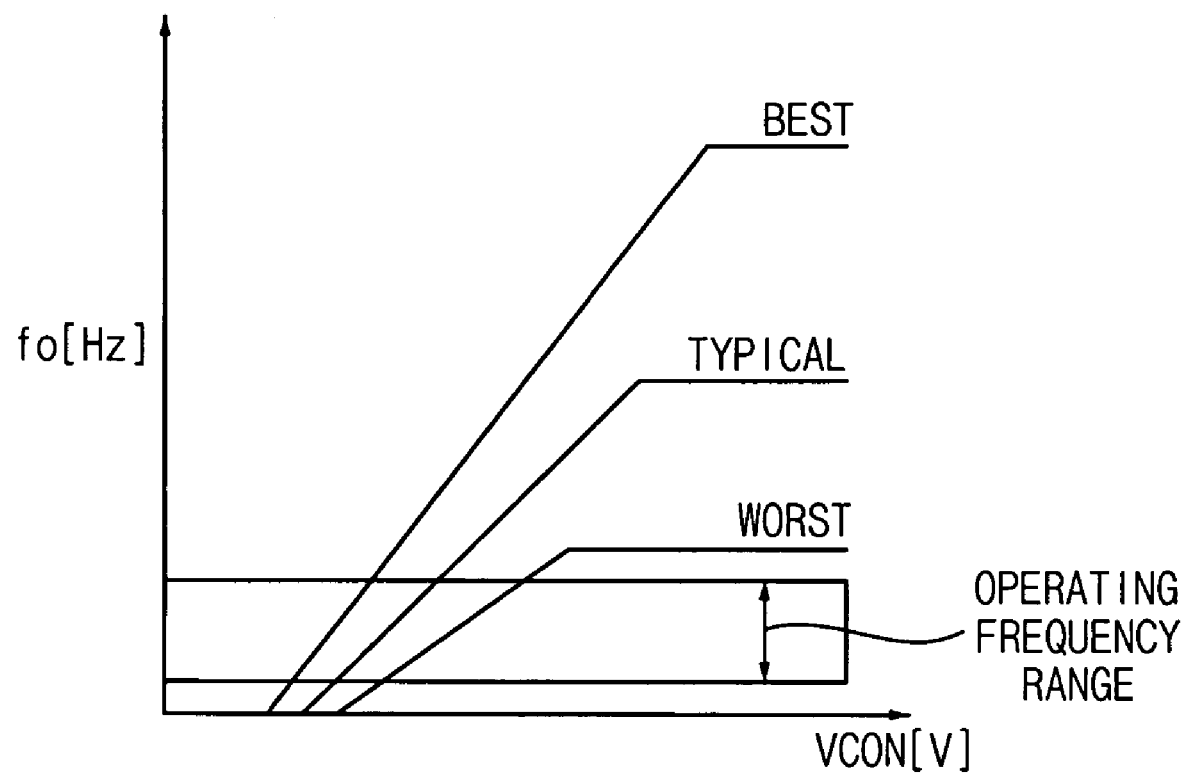
FIG. 1 is a graph of the frequency of the output signal of a conventional VCO as a function of an input voltage and the operating conditions.

Specific embodiments of the present invention are, by way of example, shown in the drawings and described in detail herein. However, the specific structural and functional details disclosed herein are merely representative for purposes of describing exemplary embodiments of the present invention. This invention may also be embodied in many alternate forms, and thus should not be construed as limited to the embodiments set forth herein, but instead covers all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
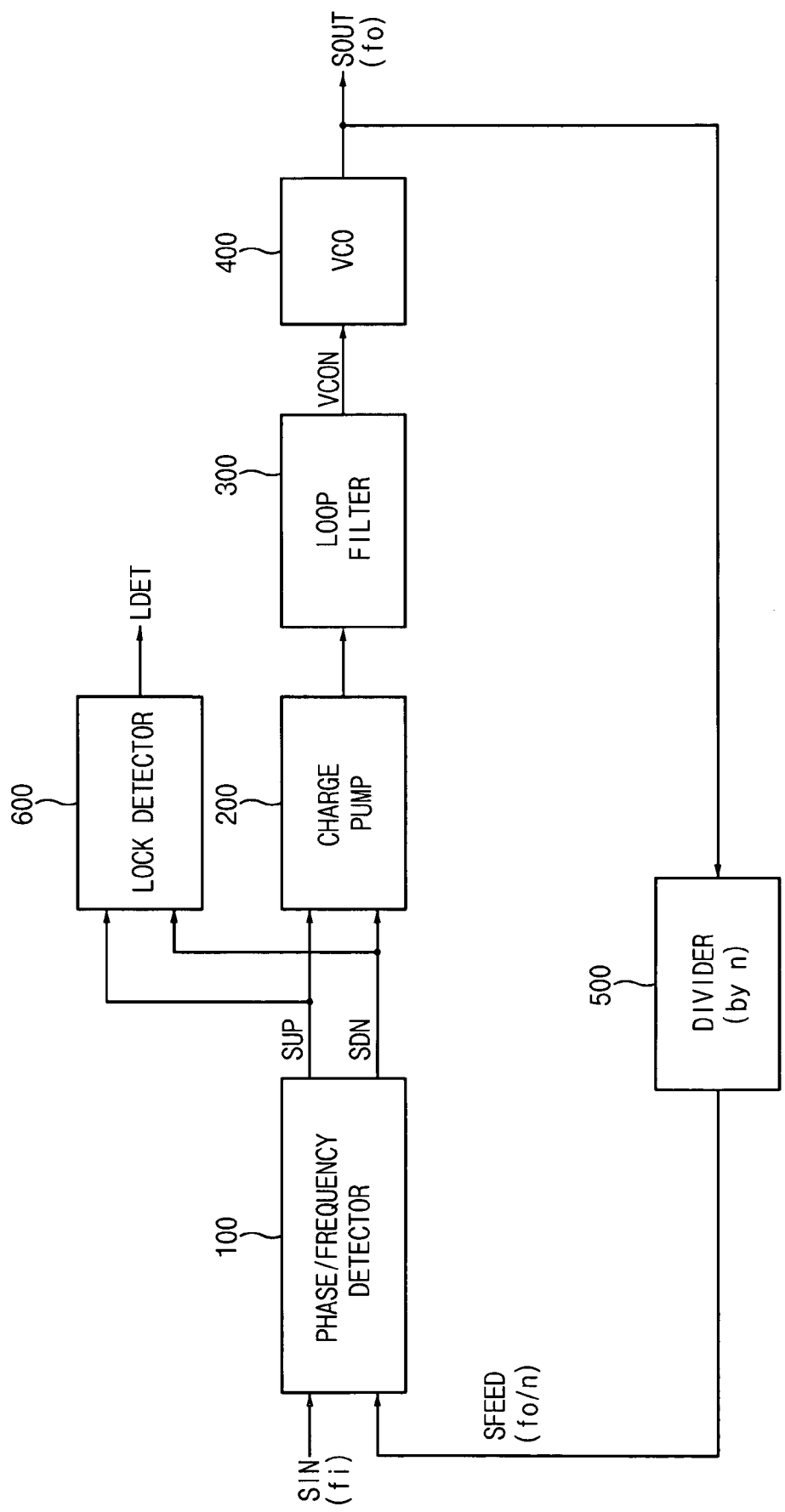
FIG. 2 is a block diagram of a PLL circuit having a voltage-controlled oscillator according to exemplary embodiments of the present invention.

FIG. 2 is a block diagram of a phase locked loop (PLL) circuit that includes a voltage-controlled oscillator according to exemplary embodiments of the present invention.

As shown in FIG. 2, the PLL circuit includes a phase/frequency detector (PFD) 100, a charge pump 200, a loop filter 300, a voltage-controlled oscillator 400, a frequency divider 500 and lock detector 600.

The PFD 100 generates an up signal (SUP) and/or a down signal (SDN) based on the phase difference (or frequency difference) between a reference signal SIN and a feedback signal SFEED.

The charge pump 200 generates an output signal, the level of which corresponds to the state of the up signal SUP and/or the down signal SDN.

The loop filter 300 removes the high frequency component of the output signal from the charge pump 200 to provide a voltage signal VCON that is input to the VCO 400.

The VCO 400 outputs a high frequency signal SOUT. The frequency of signal SOUT corresponds to the direct current (DC) level of the input voltage VCON.

The divider 500 generates a low frequency feedback signal SFEED based on the high frequency VCO output signal SOUT. The feedback signal SFEED is fed back to the PFD 100.

The lock detector 600 generates a lock detection signal LDET based on the up signal SUP and the down signal SDN. When the PLL circuit is in a lock-mode, the lock detection signal LDET is enabled and the phase (or frequency) of the reference signal SIN and the phase (or frequency) of the feedback signal SFEED are locked.

When the PLL circuit is not in the lock-mode, the lock detection signal LDET is disabled and the phase (or frequency) of the reference signal SIN and the phase (or frequency) of the feedback signal SFEED are not locked.

Figure 3:
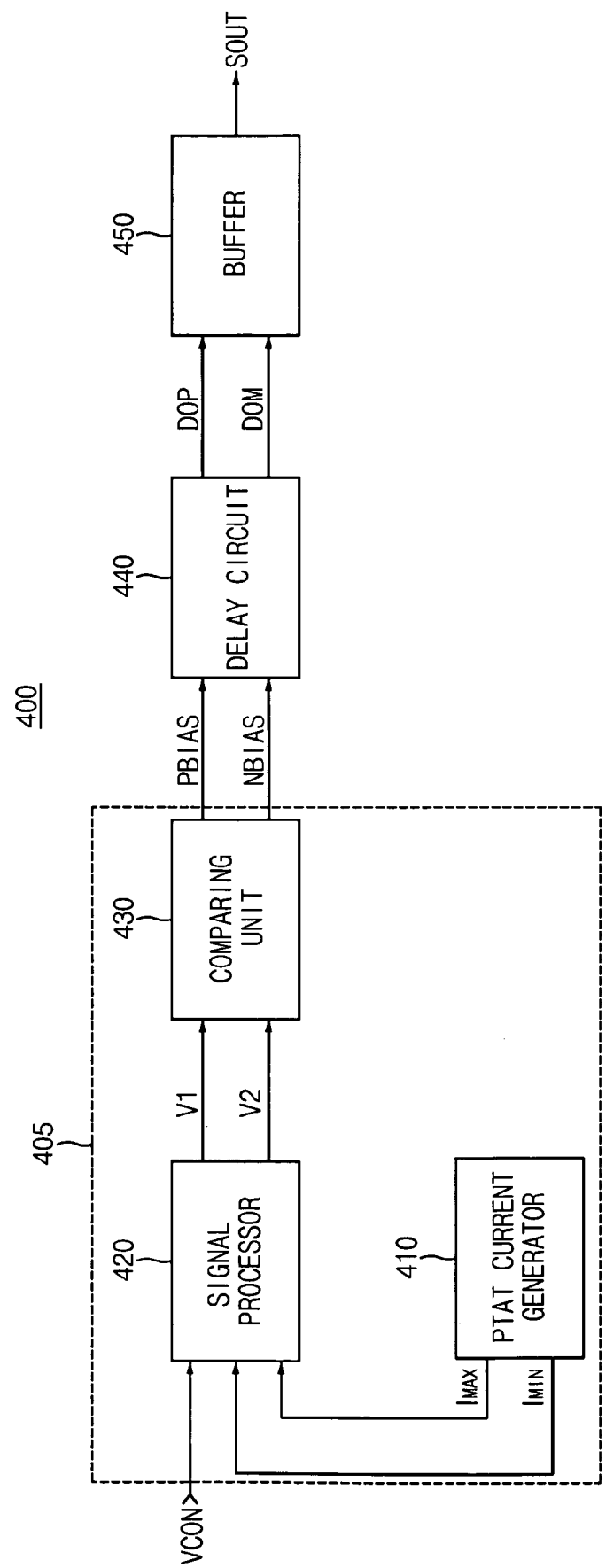
FIG. 3 is a block diagram of the voltage-controlled oscillator according to an exemplary embodiment of the present invention.

FIG. 3 is a block diagram of a voltage-controlled oscillator 400 according to an exemplary embodiment of the present invention. The voltage-controlled oscillator 400 includes a bias circuit 405, a delay circuit 440 and a buffer 450. The bias circuit 405 includes a proportional to absolute temperature (PTAT) current generator 410, a signal processor 420 and a comparing unit 430.

The voltage-controlled oscillator 400 may operate as follows.

The bias circuit 405 generates a first current signal (not shown) that varies between a maximum current signal $I_{MAX}$ and a minimum current signal $I_{MIN}$ in response to the input signal VCON. The bias circuit 405 further generates a pair of bias signals PBIAS and NB/AS that correspond to the first current signal. The PTAT current generator 410 generates a maximum current signal $I_{MAX}$ and a minimum current signal $I_{MIN}$ that are proportional to the absolute temperature.

The signal processor 420 generates a second current signal (not shown) in response to the input signal VCON and the minimum current signal $I_{MIN}$. The signal processor 420 further generates a first voltage signal V1 that corresponds to the second current signal and a second voltage signal V2 that corresponds to the maximum current signal $I_{MAX}$.

The comparing unit 430 compares the second current signal with the maximum current signal $I_{MAX}$, and generates the first current signal that varies between the maximum current signal $I_{MAX}$ and the minimum current signal $I_{MIN}$. The comparing unit 430 further generates the bias signal pair PBIAS and NBIAS that correspond to the first current signal in response to the first voltage signal V1 and the second voltage signal V2.

Figure 4:
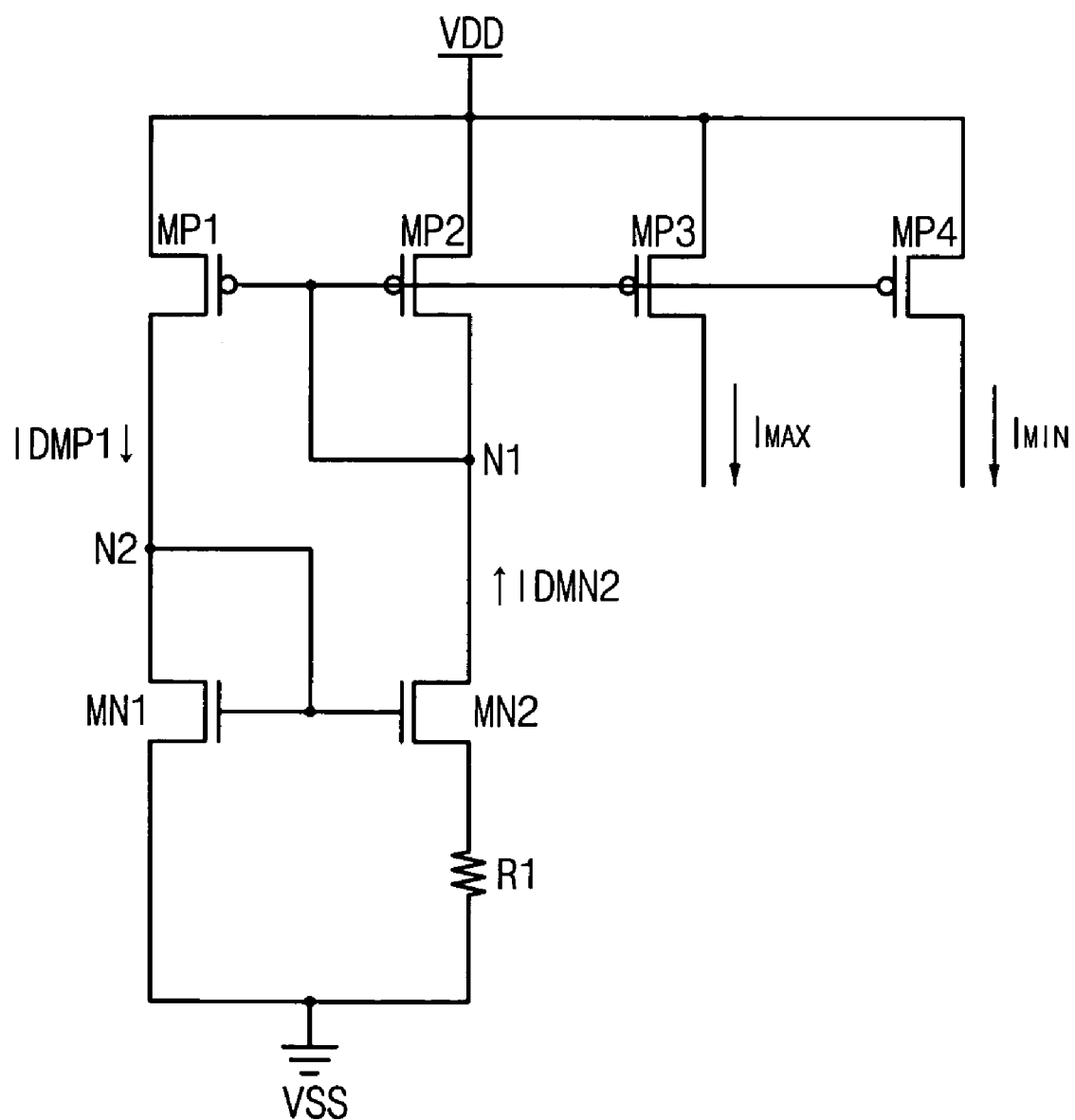
FIG. 4 is a circuit diagram of a first exemplary embodiment of the PTAT current generator of the voltage-controlled oscillator of FIG. 3.

The delay circuit 440 generates an output signal pair DOP and DOM having a frequency that varies in response to the bias signals PBIAS and NBIAS. The buffer 450 buffers the output signal pair DOP and DOM received from the delay circuit 440 to generate the VCO output signal SOUT. FIG. 4 is a circuit diagram of a first exemplary embodiment 410a of the PTAT current generator 410 included in the voltage-controlled oscillator of FIG. 3. As shown in FIG. 4, the PTAT current generator 410a includes current-mirror connected PMOS transistors MP1, MP2, MP3 and MP4, current-mirror connected NMOS transistors MN1 and MN2, and a resistor R1. The PMOS transistor MP1 has a source coupled to a first power voltage VDD, a gate coupled to a node N1 and a drain coupled to a node N2. The PMOS transistor MP2 has a source coupled to the first power voltage VDD, and a gate and a drain that are commonly coupled to the node N1. The NMOS transistor MN1 has a gate and a drain that are commonly coupled to the node N2 and a source that is coupled to a second power voltage VSS. The NMOS transistor MN2 has a drain coupled to the node N1, a gate coupled to the node N2 and a source coupled to the resistor R1. The resistor R1 is coupled between the source of the NMOS transistor MN2 and the second power voltage VSS.

The PMOS transistor MP3 has a source coupled to the first power voltage VDD, a gate coupled to the node N1, and a drain that outputs a maximum current signal $I_{MAX}$. The PMOS transistor MP4 has a source coupled to the first power voltage VDD, a gate coupled to the node N1, and a drain that outputs a minimum current signal $I_{MIN}$. The PMOS transistor MP3 may be designed to have a size (channel width/channel length) that is larger than the size (channel width/channel length) of the PMOS transistor MP4.

The PTAT current generator 410a may operate as follows.

The PMOS transistors MP1 and MP2 form a current mirror, and the NMOS transistors MN1 and MN2 form a current mirror. When the size of the PMOS transistor MP1 is identical to the size of the PMOS transistor MP2 and the size of the NMOS transistor MN1 is K (K is a positive integer) times as large as the size of the NMOS transistor MN2, the drain current IDMP1 of the PMOS transistor MP1 is identical to the drain current IDMN2 of the NMOS transistor MN2 (i.e., IDMN2=IDMP1). The loop formed by the NMOS transistors MN1 and MN2 and the resistor R1 is represented by the following equation 1.

$$\sqrt{\frac{2IDMN2}{unCox(W/L)N}} + Vth1 = \qquad \text{<Equation 1>}$$

$$\sqrt{\frac{2IDMN2}{unCoxK(W/L)N}} + Vth2 + IDMN2 \times R1$$

In equation 1, "un" denotes an electron mobility and "(W/L)×N" denotes a channel width/channel length of the NMOS transistors MN1 and MN2, respectively. Vth1 denotes the threshold voltage of the NMOS transistor MN1, Vth2 denotes the threshold voltage of the NMOS transistor MN2, Cox denotes the capacitance of a gate oxide, and K is a positive integer that denotes the ratio of the size (W/L) of the NMOS transistor MN2 to the size of the NMOS transistor MN1.

When the body effect is neglected, equation 1 may be represented by the following equation 2.

$$\sqrt{\frac{2IDMN2}{unCox(W/L)N}}\left(1 - \frac{1}{\sqrt{K}}\right) = IDMN2 \times R1 \qquad <\text{Equation 2}>$$

Equation 2 can be rearranged to solve for the drain current IDMN2 of the NMOS transistor MN2 as shown in equation 3.

$$IDMN2 = \frac{2}{unCox(W/L)N} \cdot \frac{1}{R1^2}\left(1 - \frac{1}{\sqrt{K}}\right)^2 \qquad <\text{Equation 3}>$$

As shown in equation 3, the drain current IDMN2 of the NMOS transistor MN2 is inversely proportional to the electron mobility (un).

As the ambient temperature of a semiconductor integrated circuit increases, the electron mobility (un) decreases. Thus, in the circuit 410a, the drain current IDMN2 of the NMOS transistor MN2 increases as the ambient temperature increases since the drain current IDMN2 is proportional to the absolute temperature.

As noted above, the PMOS transistors MP3 and MP4 are current-mirror connected to the PMOS transistor MP2. The maximum current signal $I_{MAX}$ flowing through the drain of the PMOS transistor MP3 and the minimum current signal $I_{MIN}$ flowing through the drain of the PMOS transistors MP4 are provided to the signal processor 420 of FIG. 3. The PMOS transistor MP3 that outputs the maximum current signal $I_{MAX}$ may be designed to be larger in size than the PMOS transistor MP4 that outputs the minimum current signal $I_{MIN}$. The maximum current signal $I_{MAX}$ and the minimum current signal $I_{MIN}$ are each proportional to the absolute temperature.

Figure 5:
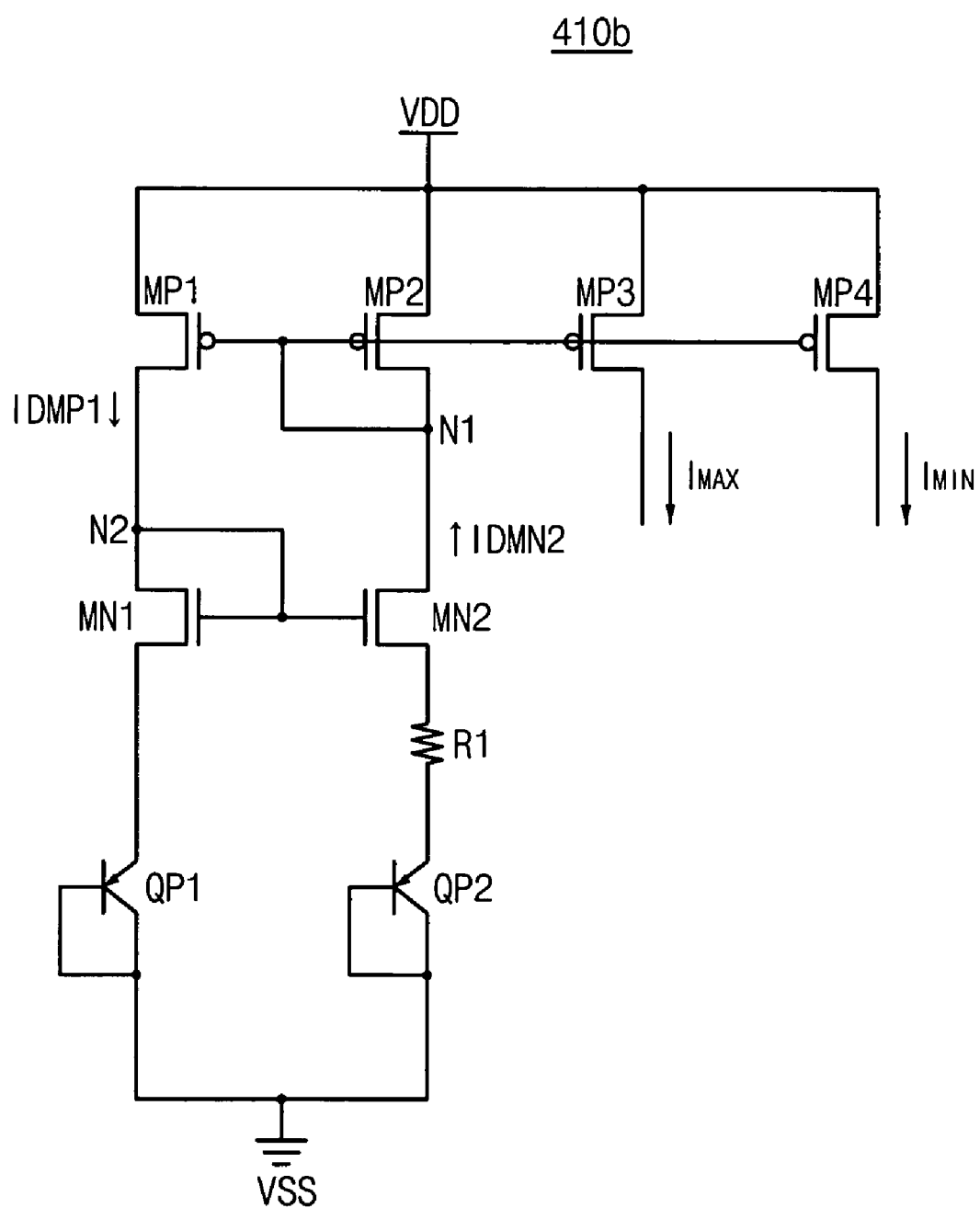
FIG. 5 is a circuit diagram of a second exemplary embodiment of the PTAT current generator of the voltage-controlled oscillator of FIG. 3.

FIG. 5 is a circuit diagram of a second exemplary embodiment 410b of the PTAT current generator 410 included in the voltage-controlled oscillator of FIG. 3.

The PTAT current generator 410b of FIG. 5 is similar to the PTAT current generator 410a of FIG. 4, but also further includes diode-coupled PNP bipolar transistors QP1 and QP2.

In the PTAT current generator 410b of FIG. 5, the electric potential of the source of NMOS transistor MN1 is identical to the electric potential of the source of NMOS transistor MN2. Accordingly, equation 4 can be derived as follows.

$$VBE1 = IDMN2 \times R1 + VBE2 \qquad <\text{Equation 4}>$$

In equation 4, VBE1 denotes the base-emitter voltage of bipolar transistor QP1, and VBE2 denotes the base-emitter voltage of bipolar transistor QP2.

When the size of the emitter of the bipolar transistor QP2 is n times as large as the size of the emitter of the bipolar transistor QP1, equation 4 can be rewritten as equation 5 using the current equation of a bipolar transistor.

$$IDMN2 = \frac{VBE1 - VBE2}{R1} = \frac{1}{R1}\left(VTln\frac{Io}{IS1} - VTln\frac{Io}{nIS1}\right) \qquad <\text{Equation 5}>$$

In equation 5, $I_O$ denotes the current flowing through both emitters of the bipolar transistors QP1 and QP2.

Because the current flowing through the drain of NMOS transistor MN1 is identical to the current flowing through the drain of NMOS transistor MN2, the current flowing through the emitter of bipolar transistor QP1 is identical to the current flowing through the emitter of bipolar transistor QP2.

IS1 denotes the saturation current of bipolar transistor QP1. The saturation current of bipolar transistor QP2 is n times as large as the saturation current of bipolar transistor QP1. Thus, equation 5 can be represented by the following equation 6.

$$IDMN2 = \frac{1}{R1}(VTln(n)) \qquad <\text{Equation 6}>$$

In equation 6, VT denotes a thermal voltage that is proportional to the absolute temperature.

The PTAT current generator of FIG. 5 generates a current that is proportional to the absolute temperature. The PMOS transistors MP3 and MP4 are coupled to the PMOS transistor MP2 in a current mirror configuration. The maximum current signal $I_{MAX}$ flowing through the drain of PMOS transistor MP3 and the minimum current signal $I_{MIN}$ flowing through the drain of PMOS transistors MP4 are provided to the signal processor 420 of FIG. 3, respectively. The size of the PMOS transistor MP3 that outputs the maximum current signal $I_{MAX}$ may be designed to be larger than the size (Width/Length) of the PMOS transistor MP4 that outputs the minimum current signal $I_{MIN}$. The drain current IDMN2 of NMOS transistor MN2 is proportional to the absolute temperature.

Figure 6:
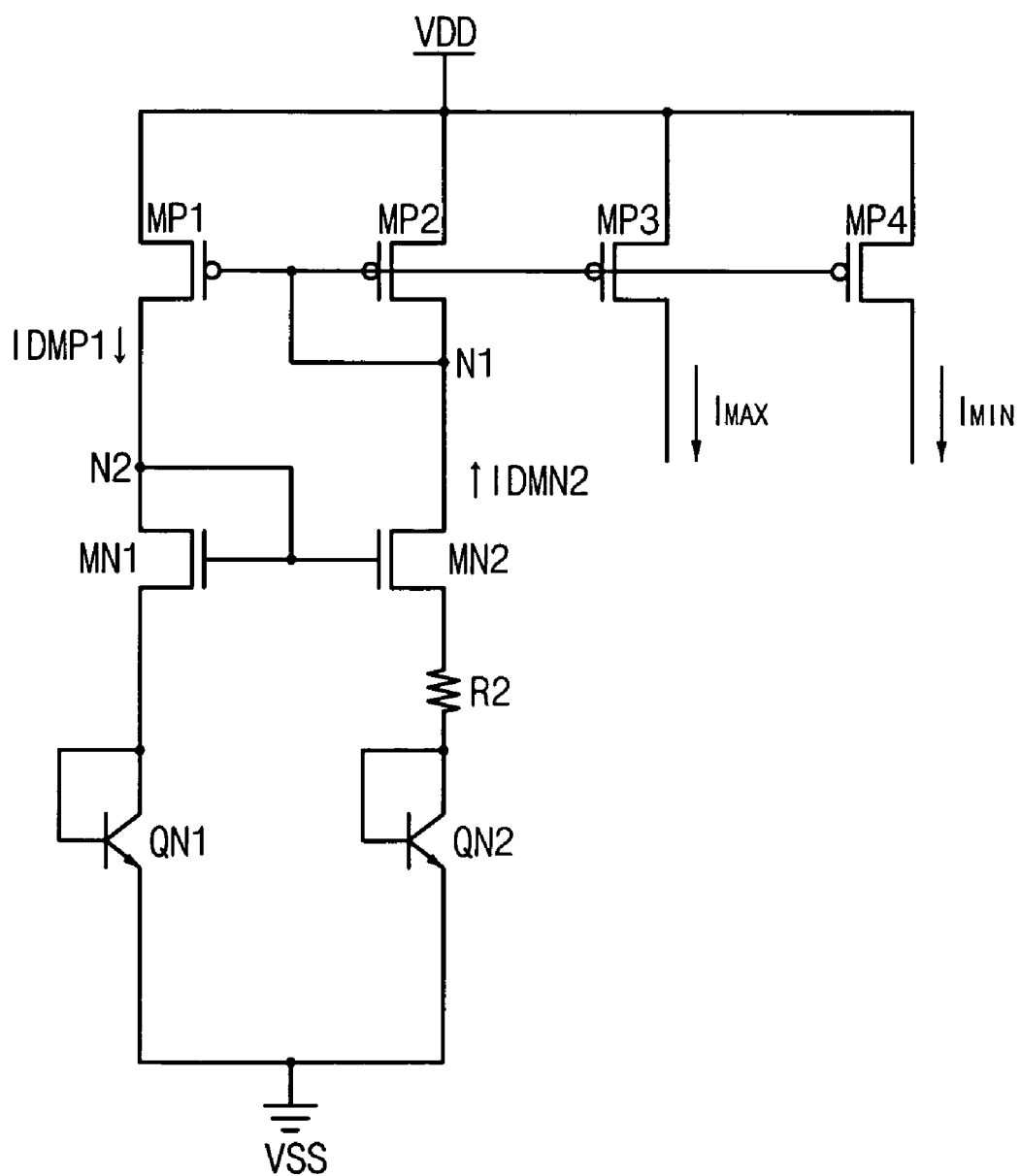
FIG. 6 is a circuit diagram of a third exemplary embodiment of the PTAT current generator of the voltage-controlled oscillator of FIG. 3.

FIG. 6 is a circuit diagram of a third exemplary embodiment 410c of the PTAT current generator 410 included in the voltage-controlled oscillator of FIG. 3. The PTAT current generator 410c of FIG. 6 is similar to the PTAT current generator 410b of FIG. 5 except that it uses diode-coupled NPN transistors QN1 and QN2 instead of diode-coupled PNP transistors QP1 and QP2.

Because the operation of the PTAT current generator 410c of FIG. 6 is similar to the operation of the PTAT current generator 410b of FIG. 5 and will be understood by those of skill in the art in light of the description of the operation of the PTAT current generator 410b above, further description of the operation of the PTAT current generator 410c is omitted.

Figure 7:
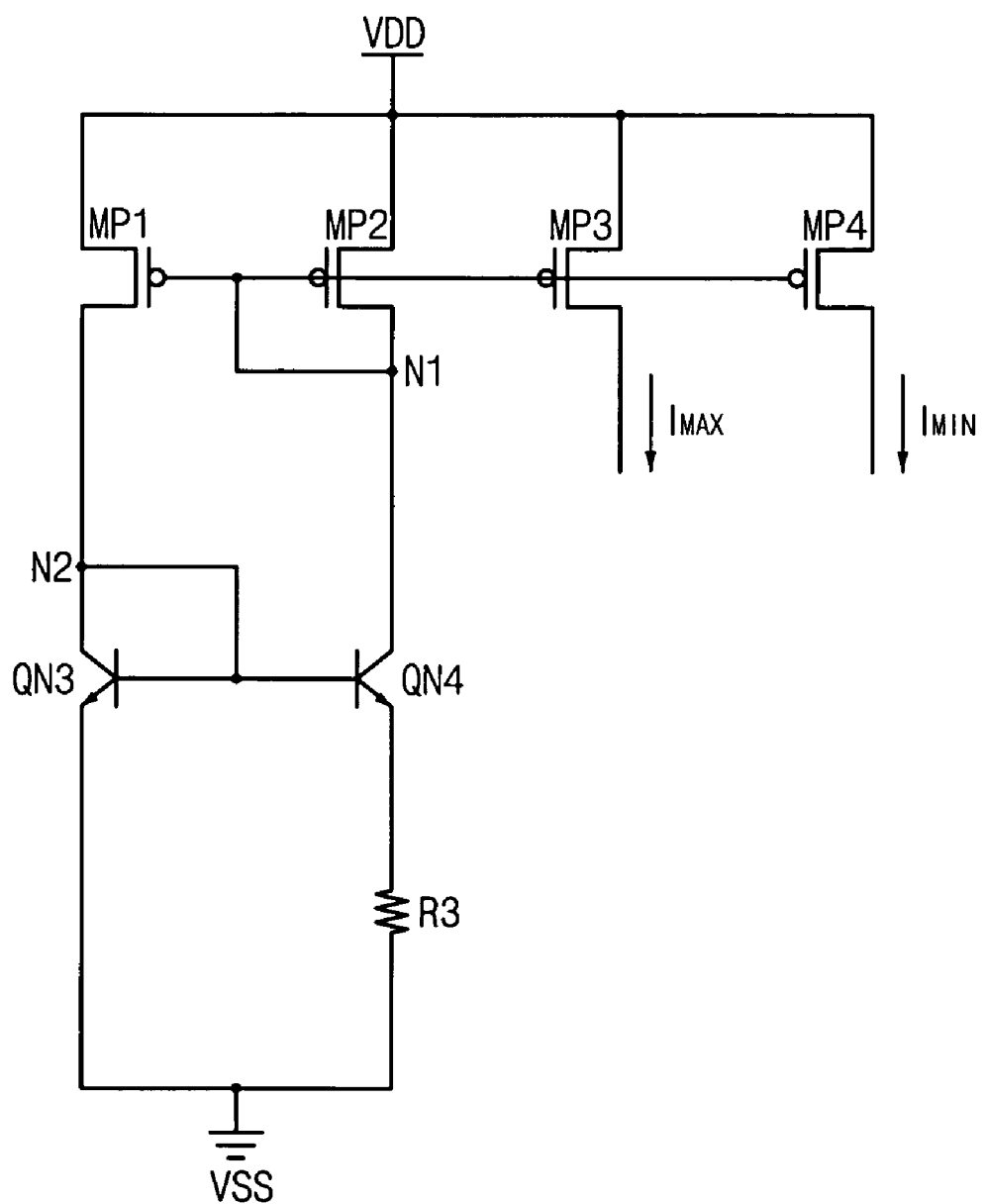
FIG. 7 is a circuit diagram of a fourth exemplary embodiment of the PTAT current generator of the voltage-controlled oscillator of FIG. 3.

FIG. 7 is a circuit diagram of a fourth exemplary embodiment 410d of the PTAT current generator 410 included in the voltage-controlled oscillator of FIG. 3. As shown in FIG. 7, the PTAT current generator 410d includes PMOS transistors MP1 through MP4 coupled in a current mirror configuration, NPN bipolar transistors QN3 and QN4 coupled in a current mirror configuration, and a resistor R3.

The PMOS transistor MP1 has a source coupled to a first power voltage VDD, a gate coupled to a node N1 and a drain coupled to a node 2. The PMOS transistor MP2 has a source coupled to the first power voltage VDD, and a gate and a drain that are commonly coupled to the node N1. The NPN bipolar transistor QN3 has a base and a collector that are commonly coupled to the node N2, and an emitter that is coupled to a second power voltage VSS. The NPN bipolar transistor QN4 has a collector that is coupled to the node N1, a base that is coupled to the node N2 and an emitter that is coupled to the resistor R3. The resistor R3 is coupled between the emitter of the NPN bipolar transistor QN4 and the second power voltage VSS.

The PMOS transistor MP3 has a source coupled to the first power voltage VDD, a gate coupled to the node N1 and a drain that outputs a maximum current signal $I_{MAX}$. The PMOS transistor MP4 has a source coupled to the first power voltage VDD, a gate coupled to the node N1 and a drain that outputs a minimum current signal $I_{MIN}$. The size of PMOS transistor MP3 may be designed to be larger than the size of the PMOS transistor MP4.

Operation of the PTAT current generator 410d in FIG. 7 is similar to the operation of the PTAT current generator 410b of FIG. 5. Because the electric potential at the base of NPN transistor QN3 is identical to the electric potential at the base of NPN transistor QN4, the emitter-base voltage of NPN transistor QN3 is equal to the sum of the emitter-base voltage of NPN transistor QN4 and the voltage across the resistor R4. The PTAT current generator 410d outputs an output current that is proportional to absolute temperature in accordance with equation 6. The maximum current signal $I_{MAX}$ and the minimum current signal $I_{MIN}$ are each proportional to the absolute temperature.

Figure 8:
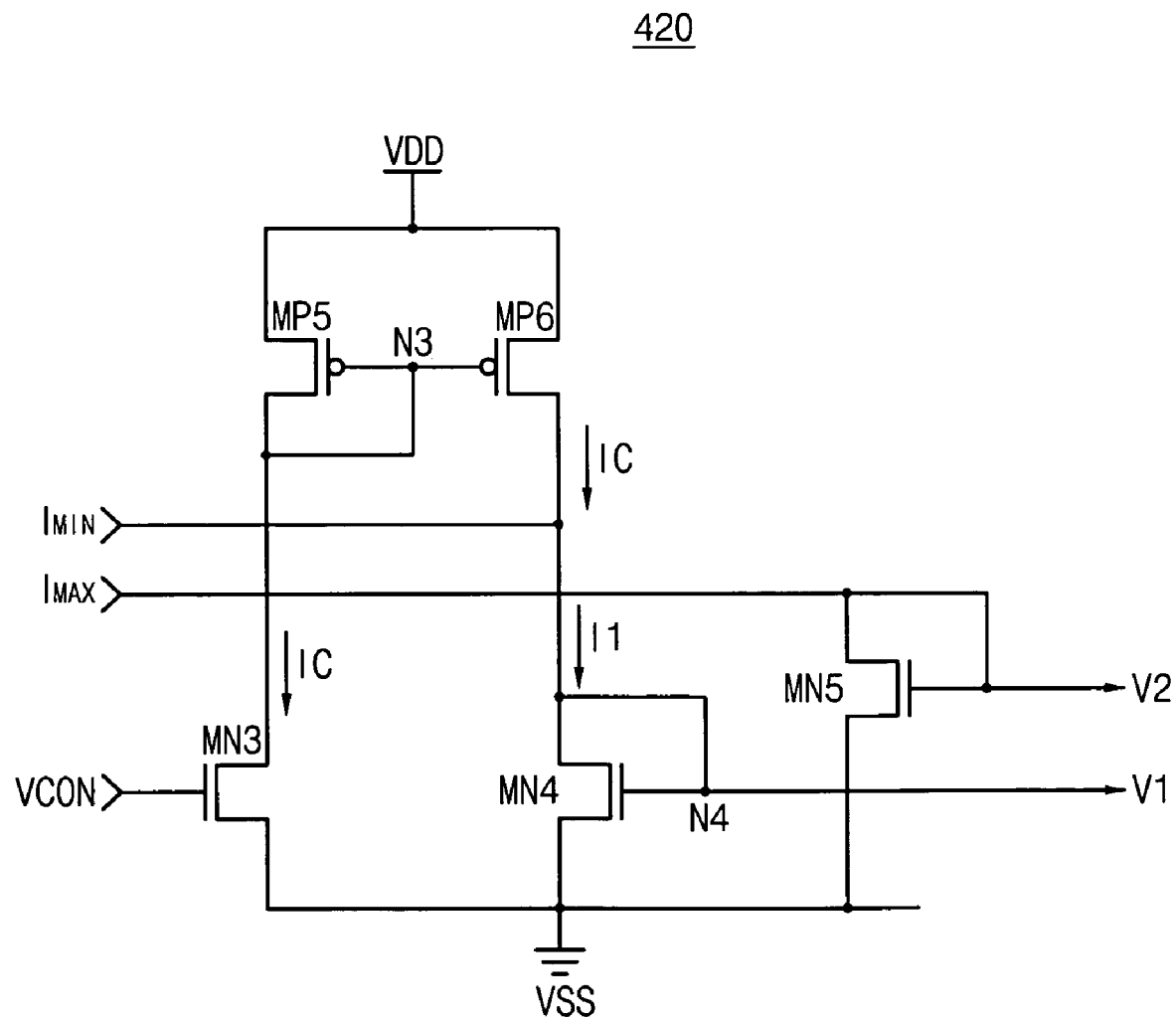
FIG. 8 is a circuit diagram of an exemplary embodiment of the signal processor of the voltage-controlled oscillator of FIG. 3.

FIG. 8 is a circuit diagram of an exemplary embodiment of the signal processor of the voltage-controlled oscillator of FIG. 3. As shown in FIG. 8, the signal processor 420 includes PMOS transistors MP5 and MP6 and NMOS transistors MN3, MN4 and MN5. The PMOS transistor MP5 has a source coupled to a first power voltage VDD and a gate and a drain that are commonly coupled to a node N3. The PMOS transistor MP6 has a source coupled to the first power voltage VDD, a gate coupled to the node N3 and a drain coupled to a node N4.

The NMOS transistor MN3 has a drain coupled to the node N3, a gate where an input signal VCON is applied and a source coupled to a second power voltage VSS. The NMOS transistor MN4 has a gate and a drain that are commonly coupled to the node N4, and a source coupled to the second power voltage VSS. The NMOS transistor MN5 has a drain that outputs a maximum current signal $I_{MAX}$, a gate that is coupled to the drain and a source that is coupled to the second power voltage VSS. A minimum current signal $I_{MIN}$ is applied to the node N4, a voltage signal V1 is output from the gate of the NMOS transistor MN4 and a voltage signal V2 is output from the gate of the NMOS transistor MN5.

The signal processor 420 shown in FIG. 8 operates as follows. The input signal VCON is provided to the voltage-controlled oscillator 400 of the PLL circuit of FIG. 2. The maximum current signal $I_{MAX}$ and the minimum current signal $I_{MIN}$ are generated by a PTAT current generator 410 such as, for example, one of the PTAT current generators depicted in FIGS. 4–7. The NMOS transistor MN3 has a current IC that varies based on the input signal VCON.

Because the PMOS transistors MP5 and MP6 are coupled in a current mirror configuration, if the PMOS transistors MP5 and MP6 are the same size, the current flowing through PMOS transistor MP6 will be identical to the current IC flowing through the NMOS transistor MN3. The NMOS transistor MN4 has a current I1 that is equal to the sum of the current flowing through the PMOS transistor MP6 and the minimum current signal $I_{MIN}$. The maximum current signal $I_{MAX}$ is applied to the drain of the NMOS transistor MN5. The voltage V1 output from the gate of the NMOS transistor MN4 (or node N4) varies in response to the current I1, and the voltage V2 output from the gate of the NMOS transistor MN5 varies in response to the maximum current signal $I_{MAX}$.

Figure 9:
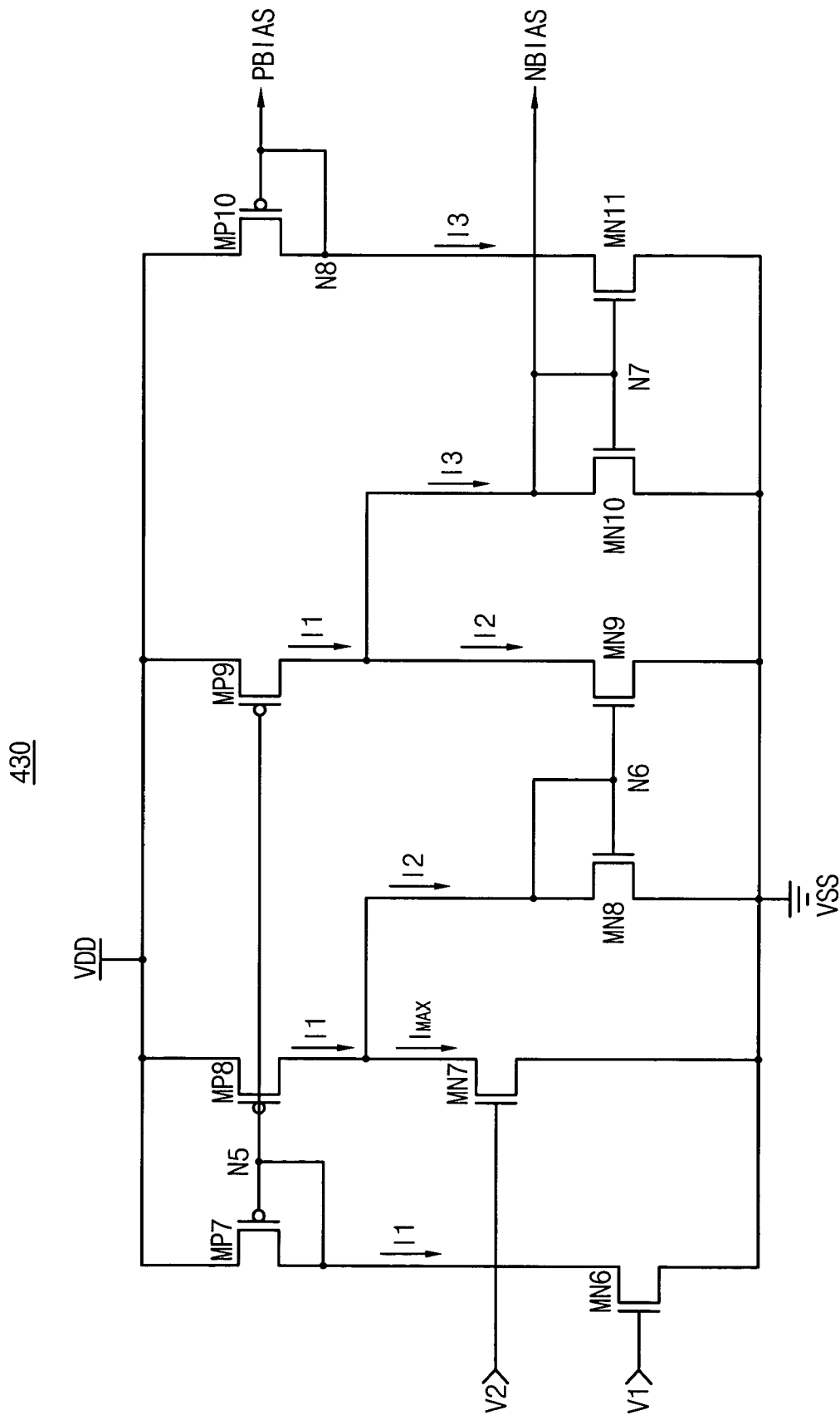
FIG. 9 is a circuit diagram of an exemplary embodiment of the comparing unit of the voltage-controlled oscillator of FIG. 3.

FIG. 9 is a circuit diagram of an exemplary embodiment of the comparing unit 430 of the voltage-controlled oscillator of FIG. 3. As shown in FIG. 9, the comparing unit 430 includes PMOS transistors MP7 through MP10 and NMOS transistors MN6 through MN11. The PMOS transistor MP7 and the NMOS transistor MN6 perform a voltage-to-current conversion. The PMOS transistor MP8, the NMOS transistor MN7 and the NMOS transistor MN8 perform a subtraction operation. The PMOS transistor MP9, the NMOS transistor MN9 and the NMOS transistor MN10 likewise perform a subtraction operation. The PMOS transistor MP7 has a source coupled to a first power voltage VDD, and a gate and a drain that are commonly coupled to a node N5.

The NMOS transistor MN6 has a drain that is coupled to the node N5, a gate where a first voltage signal V1 is provided and a source coupled to a second power voltage VSS. The PMOS transistor MP8 has a source coupled to the first power voltage VDD, a gate coupled to the node N5 and a drain coupled to a node N6. The NMOS transistor MN7 has a drain coupled to the node N6, a gate where a second voltage signal V2 is provided and a source coupled to the second power voltage VSS. The NMOS transistor MN8 has a gate and a drain that are commonly coupled to the node N6, and a source coupled to the second power voltage VSS. The PMOS transistor MP9 has a source coupled to the first power voltage VDD, a gate coupled to the node N5 and a drain coupled to a node N7. The NMOS transistor MN9 has a drain coupled to the node N7, a gate coupled to the node N6 and a source coupled to the second power voltage VSS. The NMOS transistor MN10 has a gate and a drain commonly coupled to the node N7 and a source coupled to the second power voltage VSS. The PMOS transistor MP10 has a source coupled to the first power voltage VDD and a gate and a drain that are commonly coupled to a node N8. The NMOS transistor MN11 has a drain coupled to the node N8, a source coupled to the second power voltage VSS and a gate coupled to the node N7. The voltage of node N7 acts as the bias signal NBIAS, and the voltage of node N8 acts as the bias signal PBIAS.

The comparing unit 430 shown in FIG. 9 operates as follows. The first voltage signal V1 and the second voltage signal V2 may be generated by the signal processor 420 shown in FIG. 8. The PMOS transistor MP7 has a current that varies in response to the first voltage signal V1, as the current I1 flowing through the PMOS transistor MP7 is identical to the current flowing through the NMOS transistor MN4 of FIG. 8, which current is based on the first voltage signal V1.

Because the PMOS transistor MP8 and the PMOS transistor MP9 are coupled to the PMOS transistor MP7 in a current mirror configuration, the PMOS transistors MP8 and MP9 each have the current I1. Because the gate of the NMOS transistor MN7 is coupled to the gate of the NMOS transistor MN5 of FIG. 8, the maximum current signal $I_{MAX}$ flows through the NMOS transistors MN7. The current I2 flowing through the NMOS transistor MN8 is equal to $I1-I_{MAX}$. Because the NMOS transistor MN9 is coupled to the NMOS transistor MN8 in a current mirror configuration, the current flowing through the NMOS transistor MN9 is I2.

The current I3 flowing through the NMOS transistor MN10 is equal to I1–I2. Because the gate of the NMOS transistor MN11 is coupled to the gate of the NMOS transistor MN10, the current flowing through the NMOS transistor MN11 is identical to the current I3 flowing through the NMOS transistor MN10.

The PMOS transistor MP10 has the current I3, and the bias signals PBIAS and NBIAS vary with the current I3. In particular, when the current I3 increases, the bias signal NBIAS increases and the bias signal PBIAS decreases. When the current I3 instead decreases, the bias signal NBIAS decreases and the bias signal PBIAS increases.

Because $I2=I1-I_{MAX}$ and $I3 = I1-I2$, when I1 is larger than or equal to $I_{MAX}$, the current I3 is equal to $I_{MAX}$, and when I1 is less than or equal to $I_{MAX}$, the current I3 is equal to the current I1.

Figure 10:
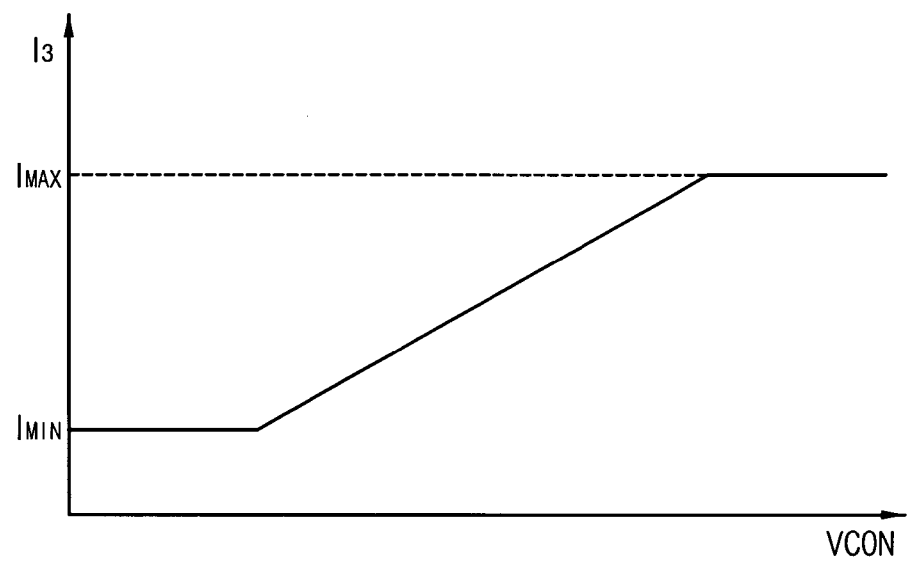
FIG. 10 is a graph of an output current I3 of a comparing unit as a function of an input voltage signal VCON of a voltage-controlled oscillator.

Referring to FIG. 8, because the current I1 is equal to the current $IC+I_{MIN}$, when the current I1 is less than or equal to $I_{MAX}$, the current I3 is equal to $IC+I_{MIN}$ FIG. 10 is a graph of the output current I3 of comparing unit 430 as a function of the input voltage signal VCON to the voltage-controlled oscillator.

As shown in FIG. 10, the output current I3 of the comparing unit 430 varies linearly between a minimum current signal $I_{MIN}$ and a maximum current signal $I_{MAX}$.

When the output current I3 of the comparing unit 430 varies only between a minimum current signal $I_{MIN}$ and a maximum current signal $I_{MAX}$, the output signal SOUT of the voltage-controlled oscillator shown in FIG. 3 has a limited frequency bandwidth.

Figure 11:
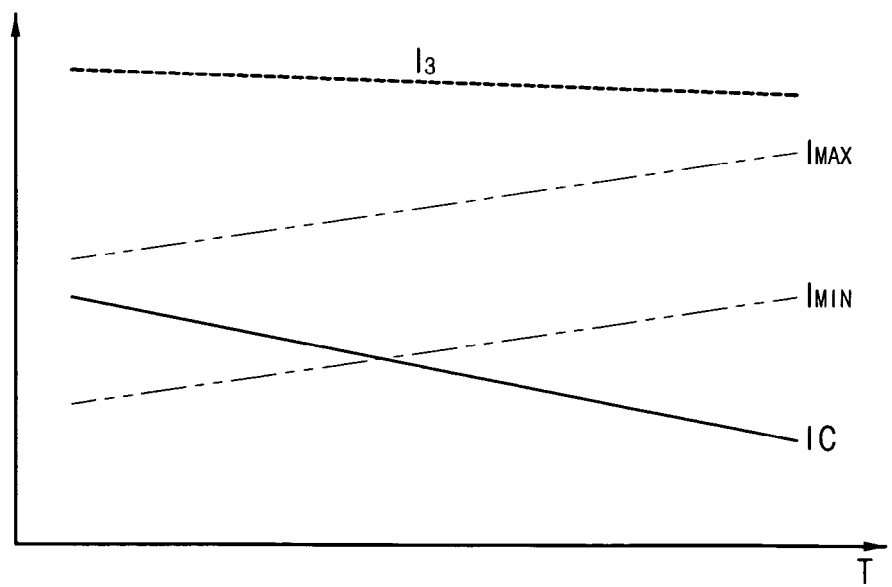
FIG. 11 is a graph of the currents I3, IC, $I_{MIN}$ and $I_{MAX}$ as a function of temperature when a voltage-controlled oscillator has a fixed input voltage signal VCON.

FIG. 11 is a graph of the currents I3, IC, $I_{MIN}$ and $I_{MAX}$ as a function of absolute temperature when the voltage-controlled oscillator has a fixed input voltage signal VCON.

As shown in FIG. 11, as the absolute temperature T increases, the minimum current signal $I_{MIN}$ and the maximum current signal $I_{MAX}$ increase, and the current IC corresponding to the input voltage signal VCON decreases.

Because the output current I3 of the comparing unit 430 is the sum of the minimum current signal $I_{MIN}$ and the current IC corresponding to the input voltage signal VCON, the output current I3 of the comparing unit 430 decreases slightly with increasing absolute temperature as shown in FIG. 11.

Figure 12:
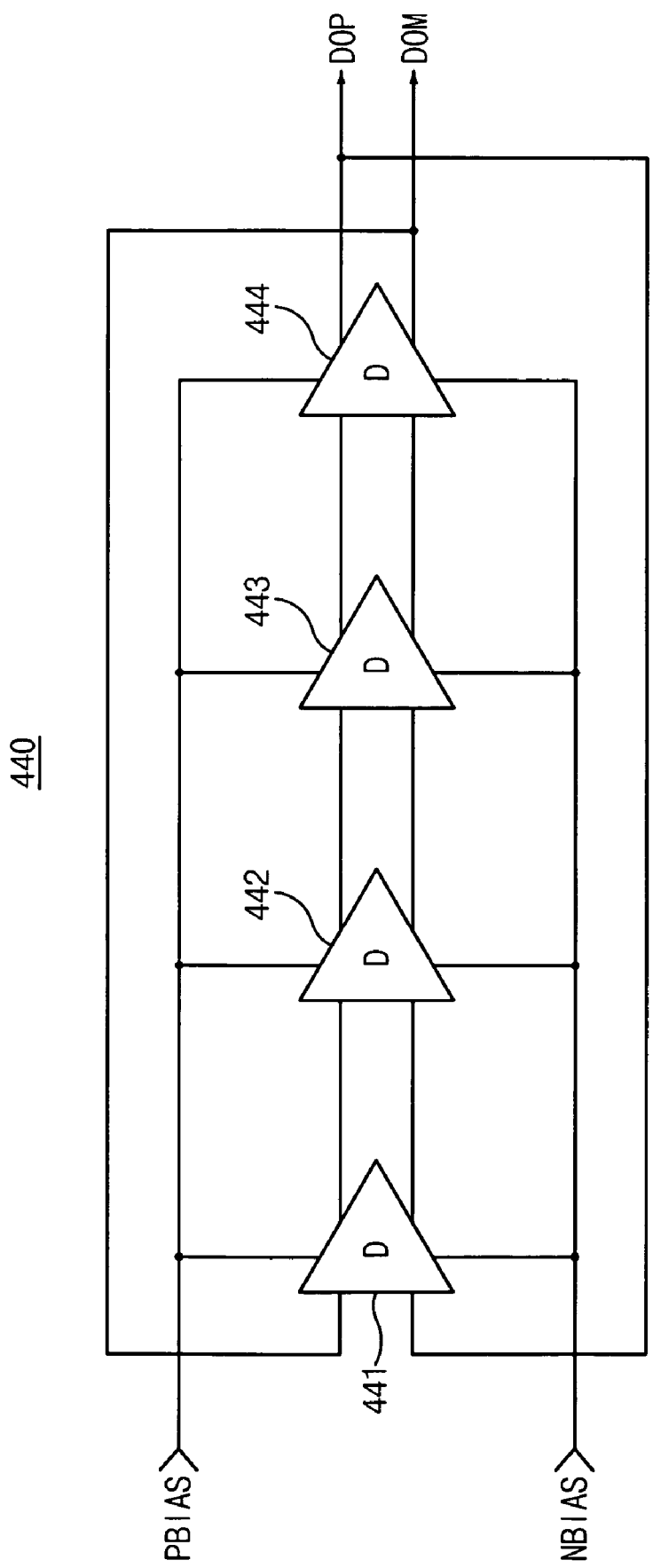
FIG. 12 is a circuit diagram of a delay circuit of the voltage-controlled oscillator of FIG. 3 according to an exemplary embodiment of the present invention.

FIG. 12 is a circuit diagram of an exemplary embodiment of the delay circuit 440 of the voltage-controlled oscillator of FIG. 3.

As shown in FIG. 12, the delay circuit 440 includes delay cells 441 through 444 which are controlled by the bias signals PBIAS and NBIAS.

An output signal pair DOP and DOM of the delay circuit 440 have a frequency that varies in response to the bias signals PBIAS and NBIAS.

Figure 13:
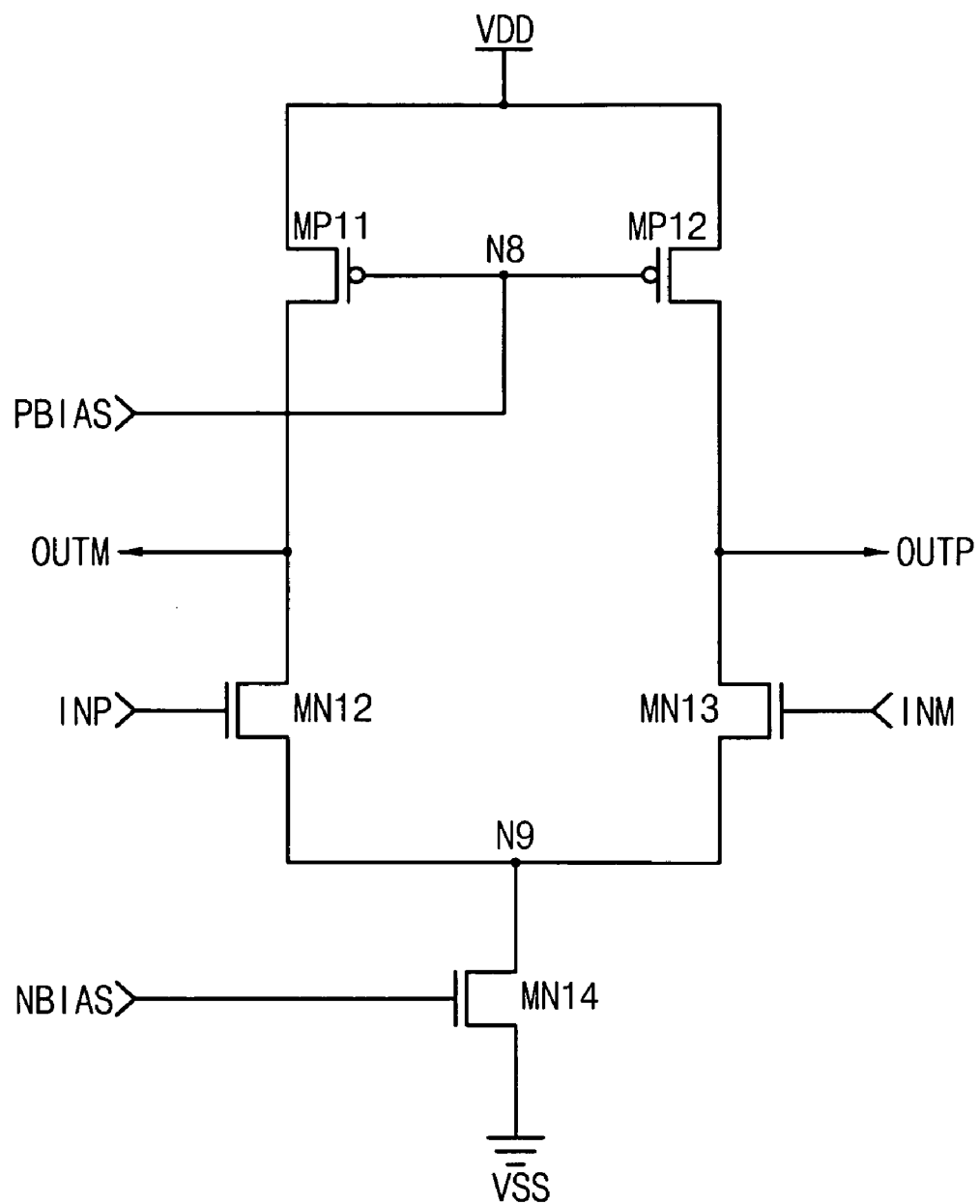
FIG. 13 is a circuit diagram of the delay cells of the delay circuit of FIG. 12 according to an exemplary embodiment of the present invention.

FIG. 13 is a circuit diagram of delay cells 441 through 444 according to an exemplary embodiment of the present invention.

As shown in FIG. 13, the delay cell includes PMOS transistors MP11 and MP12 and NMOS transistors MN12, MN13 and MN14.

The PMOS transistor MP11 has a source coupled to a first power voltage VDD and a gate coupled to a node N8. The PMOS transistor MP12 likewise has a source coupled to the first power voltage VDD and a gate coupled to the node N8.

A bias signal PBIAS is provided to the node N8. The NMOS transistor MN12 has a drain coupled to the drain of the PMOS transistor MP11, a gate that receives a first input signal INP and a source coupled to a node N9.

The NMOS transistor MN13 has a drain coupled to the drain of the PMOS transistor MP12, a gate that receives a second input signal INM and a source coupled to the node N9.

The NMOS transistor MN14 has a drain coupled to the node N9, a gate that receives the bias signal NBIAS and a source coupled to a second power voltage VSS.

The delay cell shown in FIG. 13 operates as follows.

The delay cell shown in FIG. 13 acts as a differential amplifier, generating an output signal pair OUTP and OUTM which vary with a predetermined gain according to changes in the input signals INP and INM. In particular, when the first input signal INP increases, the first output signal OUTP increases and the second output signal OUTM decreases. In contrast, when the second input signal INM increases, the second output signal OUTM increases and the first output signal OUTP decreases.

The bias signal NBIAS is applied to the gate of the NMOS transistor MN14, and the bias signal PBIAS is applied to the gates of both PMOS transistors MP11 and MP12.

As noted from FIG. 9, when the bias signal NBIAS increases, the bias signal PBIAS decreases, and when the bias signal NBIAS decreases, the bias signal PBIAS increases.

A rising time and a falling time of the output signals OUTP and OUTM of the delay cell of FIG. 13 vary according to changes in the bias signals NBIAS and PBIAS. As a result, the delay time of the delay cell changes.

Figure 14:
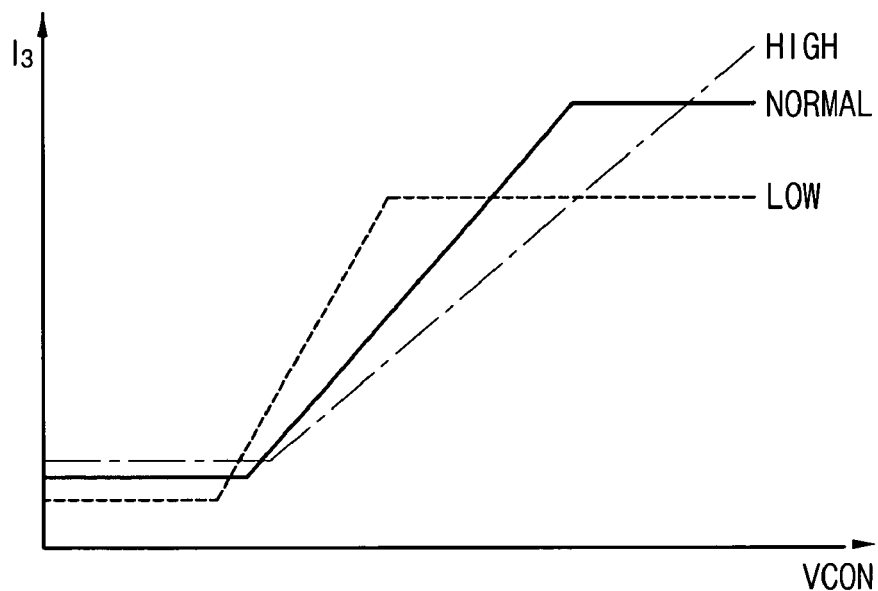
FIG. 14 is a graph of the output current I3 of a comparing unit as a function of the input voltage VCON of a VCO and temperature.

FIG. 14 is a graph of the output current I3 of the comparing unit as a function of the input voltage VCON of the VCO. The output current I3 is graphed for several different temperatures. In particular, in FIG. 14, the curve labeled "NORMAL" represents room temperature, the curve labeled "LOW" represents a temperature lower than room temperature and the curve labeled "HIGH" represents a temperature higher than room temperature.

Generally, the frequency of the output signal of a VCO at low temperature is higher than the frequency at high temperature because of the property of a MOS is transistor. Accordingly, the output current I3 of the comparing unit 430 at high temperature should be larger than the current I3 at low temperature. Referring to the graph of FIG. 14, it is noted that the maximum of the output current I3 of the comparing unit 430 at the higher temperature HIGH is larger than the maximum of the output current I3 at the lower temperature LOW.

Figure 15:
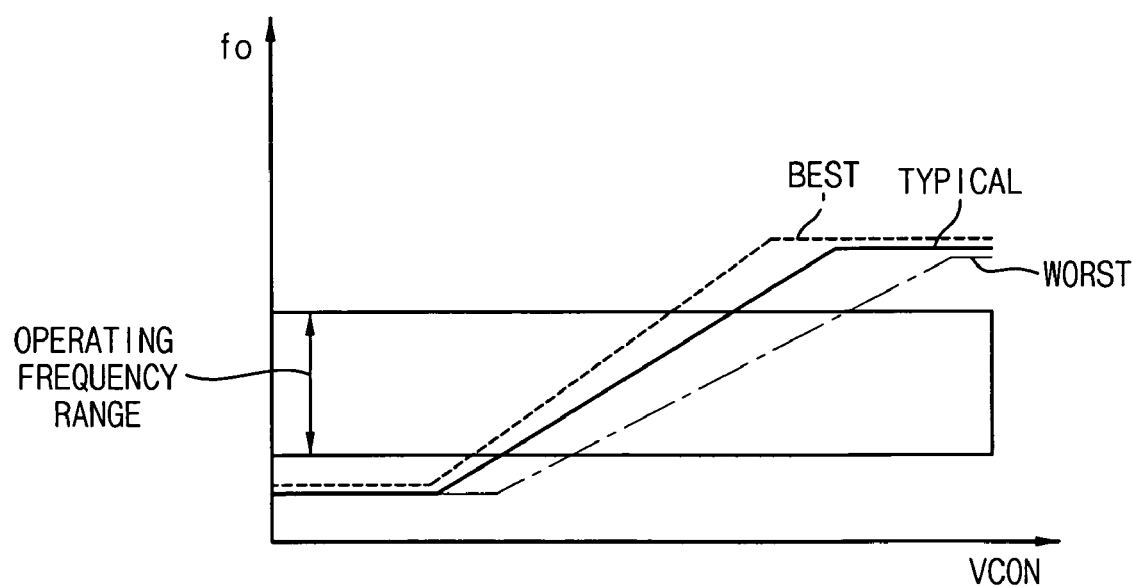
FIG. 15 is a graph of the frequency of the output signal of a VCO according to certain embodiments of the present invention.

FIG. 15 is a graph of the frequency of a VCO output signal according to embodiments of the present invention that varies as a function of the operating conditions.

As shown in FIG. 14, because the maximum current value and the minimum current value become larger as the temperature goes up, a VCO output signal has an operating frequency range that maintains a similar value regardless of the operating temperature.

Figure 16:
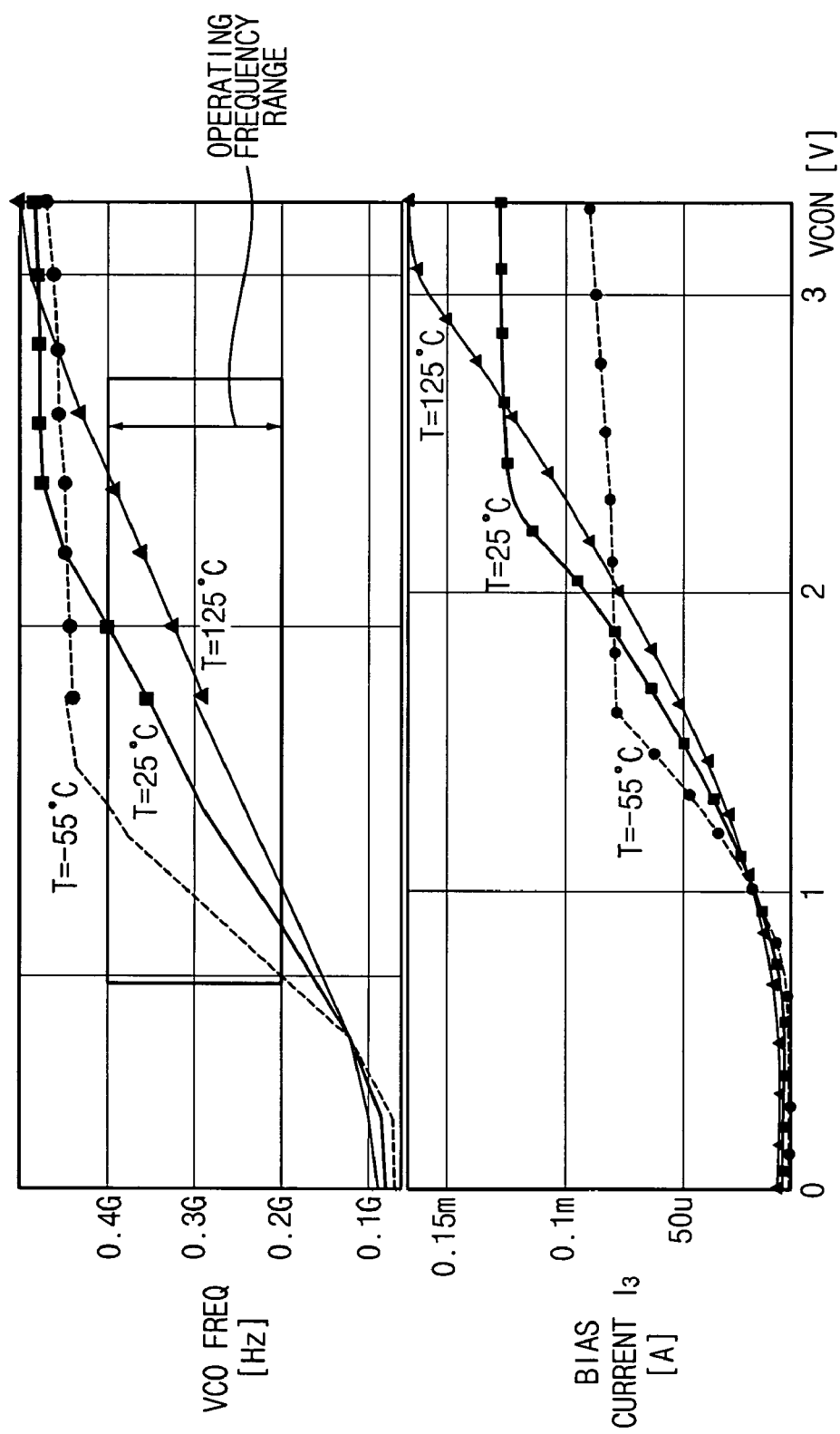
FIG. 16 is a simulation graph of the frequency of the output signal of a VCO according to certain embodiments of the present invention and an output current I3 of a comparing unit according to certain embodiments of the present invention according to temperature variations in a fixed process condition and a fixed power voltage condition.

FIG. 16 is a simulation graph illustrating a frequency characteristic of a VCO output signal and an output current I3 of a comparing unit as a function of three different temperatures in a fixed process condition and a fixed power voltage condition.

As shown in FIG. 16, as the input signal VCON of the VCO increases, the frequency of the VCO output signal increases. As is also apparent from FIG. 16, even with variations in the operating temperature over the range of about −55° C. to about 125° C., the maximum operating frequency and the minimum operating frequency are maintained at similar values.

As shown in FIG. 16, the VCO can stably operate in a range of 200 MHz through 400 MHz.

Hereinafter, operation of the VCO according to an exemplary embodiment of the present invention depicted in FIG. 3 is explained with reference to FIGS. 3 through 16.

The bias circuit 405 generates (1) a maximum current signal $I_{MAX}$, (2) a minimum current signal $I_{MIN}$, (3) a current signal I3 which varies in a range from the maximum current signal $I_{MAX}$ to the minimum current signal $I_{MIN}$ in response to an input signal VCON and (4) a bias signal pair NBIAS and PBIAS that correspond to the current signal I3.

The delay circuit 440 generates output signals DOP and DOM which vary in response to the bias signal pair NBIAS and PBIAS.

A buffer 450 buffers the output signal DOP and DOM output from the delay circuit 440 to output a VCO output signal SOUT.

As described above, because the operating frequency range of the voltage-controlled oscillators according to exemplary embodiments of the present invention are limited by a bias circuit, the VCO can minimize a gain and limit a maximum operating frequency to a predetermined level.

Additionally, because the VCO includes a PTAT current generator in the bias circuit, the VCO can compensate for variations of the VCO output frequency according to absolute temperature.

While the example embodiments of the present invention and their advantages have been described in detail, it should be understood that various changes, substitutions and alterations may be made herein without departing from the scope of the invention.

What is claimed is:

1. A voltage-controlled oscillator, comprising:
   a bias circuit that is configured to generate an output current having a value that is constrained to fall within a range between a minimum current value and a maximum current value in response to an input signal; and
   a delay circuit that is configured to generate an output signal having a frequency that is based on the value of the output current of the bias circuit.

2. The voltage-controlled oscillator of claim 1, wherein the bias circuit includes a first circuit that is configured to vary at least one of the maximum current value and/or the minimum current value as a function of a temperature of the bias circuit.

3. The voltage-controlled oscillator of claim 1, wherein the bias circuit is further configured to generate one or more bias signals having respective values that are based on the output current, and wherein the delay circuit is configured to generate an output signal having a frequency that is based on the value of the output current of the bias circuit in that the delay circuit is configured to set the frequency of output signal based on the values of the one or more bias signals.

4. The voltage-controlled oscillator of claim 1, wherein the operating frequency range of the voltage-controlled oscillator is based on the maximum current value and the minimum current value.

5. The voltage-controlled oscillator of claim 2, wherein the first circuit is configured to increase the maximum current value and the minimum current value with increasing temperature.

6. The voltage-controlled oscillator of claim 1, wherein the frequency of the output signal is substantially proportional to a voltage level of the input signal.

7. The voltage-controlled oscillator of claim 3, wherein the one or more bias signals comprise a first voltage bias signal and a second voltage bias signal.

8. The voltage-controlled oscillator of claim 7, wherein the bias circuit comprises:
   a signal processor that is configured to add a first current signal that has a value that is proportional to a voltage of the input signal to a minimum current signal that has the minimum current value to generate a second current signal, generate a first voltage signal that corresponds to the second current signal, and generate a second voltage signal that corresponds to a maximum current signal that has the maximum current value; and
   a comparing unit that is configured to generate the output current of the bias circuit in response to the first voltage signal and the second voltage signal, and generate the first voltage bias signal and the second voltage bias signal based on the output current of the bias circuit.

9. The voltage-controlled oscillator of claim 8, wherein the comparing unit is configured to:
   subtract the maximum current signal from the second current signal to generate a third current signal; and
   subtract the third current signal from the second current signal to generate the output current of the bias circuit.

10. The voltage-controlled oscillator of claim 9, wherein the comparing unit comprises:
    a voltage-to-current converter that is configured to convert the first voltage signal to the second current signal;
    a first subtracter circuit that is configured to subtract the maximum current signal from the second current signal to generate the third current signal; and
    a second subtracter circuit that is configured to subtract the third current signal from the second current signal to generate the output current of the bias circuit.

11. The voltage-controlled oscillator of claim 10, wherein the comparing unit further comprises a current-to-voltage converter that is configured to generate the first voltage bias signal and the second voltage bias signal based on the output current of the bias circuit.

12. The voltage-controlled oscillator of claim 10, wherein the output current of the bias circuit has a current value that is substantially equal to the maximum current value when the second current signal is larger than the maximum current signal, and has a current value that is substantially equal to a current value of the second current signal when the second current signal is less than or equal to the maximum current signal.

13. The voltage-controlled oscillator of claim 9, wherein the maximum current signal and the minimum current signal vary based on a temperature of the bias circuit.

14. The voltage-controlled oscillator of claim 13, wherein the maximum current signal and the minimum current signal increase substantially linearly in proportion to the temperature.

15. The voltage-controlled oscillator of claim 9, wherein the first current signal decreases with increasing temperature and the minimum current signal increases with increasing temperature.

16. The voltage-controlled oscillator of claim 15, wherein the output current of the bias circuit decreases with increasing temperature.

17. The voltage-controlled oscillator of claim 9, wherein the bias circuit further comprises a proportional to absolute temperature (PTAT) current generator circuit that is configured to generate the maximum current signal and the minimum current signal, each of which vary substantially in proportion to an absolute temperature.

18. The voltage-controlled oscillator of claim 17, wherein the PTAT current generator circuit comprises:
    a first PMOS transistor having a source coupled to a first power voltage, a gate coupled to a first node and a drain coupled to a second node;
    a second PMOS transistor having a source coupled to the first power voltage and a gate and a drain commonly coupled to the first node;
    a first NMOS transistor having a gate and a drain commonly coupled to the second node, and a source coupled to a second power voltage;
    a second NMOS transistor having a drain coupled to the first node and a gate coupled to the second node;
    a resistor coupled between a source of the second NMOS transistor and the second power voltage;
    a third PMOS transistor having a source coupled to the first power voltage, a gate coupled to the first node and a drain that outputs the minimum current signal; and
    a fourth PMOS transistor having a source coupled to the first power voltage, a gate coupled to the first node and a drain that outputs the maximum current signal.

19. The voltage-controlled oscillator of claim 18, wherein the size of the third PMOS transistor is smaller than the size of the fourth PMOS transistor.

20. The voltage-controlled oscillator of claim 9, wherein the delay circuit comprises one or more delay cells coupled in a cascade configuration, and wherein the delay circuit is configured to generate the output signal having a frequency that changes in response to changes in the first and second voltage bias signals.

21. A bias circuit comprising:
    a signal processor that is configured to
        add a first current signal that has a value that is proportional to a voltage of an input signal to a minimum current signal that has a minimum current value to generate a second current signal;
        generate a first voltage signal that corresponds to the second current signal;
        generate a second voltage signal that corresponds to a maximum current signal that has a maximum current value; and
    a comparing unit that is configured to generate an output current in response to the first voltage signal and the second voltage signal.

22. The bias circuit of claim 21, wherein the comparing unit is further configured to:
    subtract the maximum current signal from the second current signal to generate a third current signal; and
    subtract the third current signal from the second current signal to generate the output current.

23. The bias circuit of claim 22, wherein the comparing unit comprises:
    a voltage-to-current converter that is configured to convert the first voltage signal to the second current signal;
    a first subtracter circuit that is configured to subtract the maximum current signal from the second current signal to generate the third current signal; and
    a second subtracter circuit that is configured to subtract the third current signal from the second current signal to generate the output current.

24. The bias circuit of claim 23, wherein the comparing unit further comprises a current-to-voltage converter that is configured to generate the first voltage bias signal and the second voltage bias signal based on the output current.

25. The bias circuit of claim 21, wherein the output current has a current value that is substantially equal to the maximum current value when the second current signal is larger than the maximum current signal, and has a current value substantially equal to a current value of the second current signal when the second current signal is less than or equal to the maximum current signal.

26. The bias circuit of claim 21, wherein the maximum current signal and the minimum current signal vary based on a temperature of the bias circuit.

27. The bias circuit of claim 21, wherein the maximum current signal and the minimum current signal increase substantially linearly in proportion to the temperature.

28. The bias circuit of claim 27, wherein the first current signal decreases with increasing temperature and the minimum current signal increases with increasing temperature.

29. The bias circuit of claim 21, wherein the comparing unit is further configured to generate a first voltage bias signal and a second voltage bias signal based on the output current.

30. A biasing method comprising:
    adding a first current signal that corresponds to an input voltage signal to a minimum current signal to generate a second current signal;
    generating a first voltage signal that corresponds to the second current signal;
    generating a second voltage signal that corresponds to a maximum current signal; and
    generating a bias output current that is constrained to have a current between the minimum current signal and the maximum current signal in response to the first voltage signal and the second voltage signal.

31. The biasing method of claim 30, wherein generating a bias output current comprises:
    subtracting the maximum current signal from the second current signal to generate a third current signal; and
    subtracting the third current signal from the second current signal to generate the bias output current.

32. A method of generating an output signal in a voltage-controlled oscillator that includes a bias circuit, the method comprising:
    setting a maximum current value and a minimum current value;
    generating a first current in the bias circuit having a value that is constrained to be between the maximum current value and the minimum current value; and
    setting a frequency of the output signal of the voltage-controlled oscillator based on the value of the first current in the bias circuit.

33. A method of controlling the gain of a voltage-controlled oscillator, the method comprising:
    adjusting the frequency of an output signal of the voltage-controlled oscillator in response to an input signal to the voltage-controlled-oscillator while constraining the amount that the frequency of the output signal is adjusted during any particular adjustment.

* * * * *